(12) United States Patent
Ontalus et al.

(10) Patent No.: US 7,855,110 B2
(45) Date of Patent: Dec. 21, 2010

(54) FIELD EFFECT TRANSISTOR AND METHOD OF FABRICATING SAME

(75) Inventors: Viorel Ontalus, Danbury, CT (US); Robert Robison, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 29 days.

(21) Appl. No.: 12/169,118

(22) Filed: Jul. 8, 2008

(65) Prior Publication Data
US 2010/0006952 A1 Jan. 14, 2010

(51) Int. Cl.
*H01L 21/336* (2006.01)
(52) U.S. Cl. .................. 438/197; 438/305; 438/306; 257/E21.433
(58) Field of Classification Search .......... 438/197, 438/301, 305, 306, E21.433
See application file for complete search history.

(56) References Cited

U.S. PATENT DOCUMENTS

| | | | |
|---|---|---|---|
| 6,444,550 B1 | 9/2002 | Hao et al. | |
| 6,475,888 B1 | 11/2002 | Sohn | |
| 6,617,229 B2 * | 9/2003 | Kim | 438/585 |
| 6,642,122 B1 | 11/2003 | Yu | |
| 6,667,200 B2 | 12/2003 | Sohn et al. | |
| 6,667,513 B1 * | 12/2003 | Skotnicki et al. | 257/335 |
| 6,730,568 B2 | 5/2004 | Sohn | |
| 6,753,230 B2 | 6/2004 | Sohn et al. | |
| 7,211,516 B2 * | 5/2007 | Chen et al | 438/682 |
| 7,227,205 B2 * | 6/2007 | Bryant et al. | 257/288 |
| 2005/0158956 A1 | 6/2005 | Poon et al. | |
| 2007/0141858 A1 | 6/2007 | Gu | |
| 2007/0155073 A1 * | 7/2007 | Goktepeli et al. | 438/197 |
| 2008/0145991 A1 * | 6/2008 | Mehrotra et al. | 438/303 |

OTHER PUBLICATIONS

Susan K. Earles; Nonmelt Laser Annealing of Boron Implanted Silicon; A Dissertation presented to the Graduate School of the University of Florida in partial fulfillment of the requirements for the Degree of Doctor of Philosophy; University of Florida 2002; 178 pages.
Borland et al.; Implantation and Annealing Options for 65 nm Node SDE Formation; Retrieved from the Internet: Semiconductor International Print Page <http://www.semiconductor.net/index.asp?layout=articlePrint&articleID...>; [Retrieved Jun. 21, 2008]; 3 pages, dated Apr. 1, 2003.
Asenov et al.; Suppression of Random Dopant-Induced Threshold Voltage Fluctuations in Sub-0.1-μm MOSFET's with Epitaxial and δ-Doped Channels; IEEE Transactions on Electron Devices, vol. 46, No. 8, Aug. 1999; pp. 1718-1724.
Kennel et al.; Kinetics of Shallow Junction Activation: Physical Mechanisms; Intel Corporation; 36 pages, no month/year.

* cited by examiner

*Primary Examiner*—Michael Trinh
(74) *Attorney, Agent, or Firm*—Schmeiser, Olsen & Watts; Richard M. Kotulak

(57) ABSTRACT

An FET and method of fabricating an FET. The method includes forming a gate dielectric layer on a top surface of a silicon region of a substrate and forming a gate electrode on a top surface of the gate dielectric layer; forming a source and a drain in the silicon region and separated by a channel region under the gate electrode, the source having a source extension extending under the gate electrode and the drain having a drain extension extending under the gate electrode, the source, source extension, drain and drain extension doped a first type; and forming a source delta region contained entirely within the source and forming a drain delta region contained entirely within the drain, the delta source region and the delta drain region doped a second dopant type, the second dopant type opposite from the first dopant type.

15 Claims, 8 Drawing Sheets

FIELD EFFECT TRANSISTOR AND METHOD OF FABRICATING SAME

FIELD OF THE INVENTION

The present invention relates to the field of field effect transistors; more specifically, it relates to a structure for a field effect transistor and the method of fabricating the field effect transistor.

BACKGROUND OF THE INVENTION

As the dimensions of field effect transistors decrease, short channel effects have become a significant problem. Short channel effects result in transistors that are more leaky than expected. Accordingly, there exists a need in the art to mitigate the deficiencies and limitations described hereinabove.

SUMMARY OF THE INVENTION

A first aspect of the present invention is a method of fabricating a field effect transistor, comprising: (a) forming a gate dielectric layer on a top surface of a silicon region of a substrate and forming a gate electrode on a top surface of the gate dielectric layer; (b) forming a source and a drain in the silicon region of the substrate on opposite sides of the gate electrode, the source and the drain separated by a channel region under the gate electrode, the source having a source extension extending under the gate electrode and the drain having a drain extension extending under the gate electrode, the source, source extension, drain and drain extension doped a first type; and (c) forming a source delta region contained entirely within the source, a region of the source extension intervening between the source delta region and the channel region and forming a drain delta region contained entirely within the drain, a region of the drain extension intervening between the drain delta region and the channel region, the delta source region and the delta drain region doped a second dopant type, the second dopant type opposite from the first dopant type.

A second aspect of the present invention is a method of fabricating a field effect transistor, comprising: (a) forming a gate dielectric layer on a top surface of a silicon region and forming a gate electrode on a top surface of the gate dielectric layer; after (a), (b) forming first sidewall spacers on sidewalls of the gate electrode; after (b), (c) performing an angled halo ion implantation of a first dopant type and a perpendicular extension ion implantation of a second dopant type; after (c), (d) forming second sidewall spacers on the first sidewall spacers; after (d), (e) performing a perpendicular or angled source/drain ion implantation of the second dopant type; after (e), (f) performing a first activation anneal to form a source and a drain in the silicon region on opposite sides of the gate electrode, the source and the drain separated by a channel region under the gate electrode, the source having a source extension extending under the gate electrode and the drain having a drain extension extending under the gate electrode; after (e), (g) removing the second sidewall spacers; after (f) and (g), (h) performing a perpendicular counter ion implantation of the first dopant type; after (h), (i) forming third sidewall spacers on the first sidewall spacers; after (i), (j) performing a perpendicular counter-counter ion implantation of the second dopant type; and after (j), (k) performing a diffusionless second activation anneal to form a source delta region contained entirely within the source, a region of the source extension intervening between the source delta region and the channel region and a drain delta region contained entirely within the drain, a region of the drain extension intervening between the drain delta region and the channel region, the delta source region.

A third aspect of the present invention is a field effect transistor, comprising: a gate dielectric layer on a top surface of a silicon region of a substrate and a gate electrode on a top surface of the gate dielectric layer; a source and a drain in the silicon region of the substrate on opposite sides of the gate electrode, the source and the drain separated by a channel region under the gate electrode, the source having a source extension extending under the gate electrode and the drain having a drain extension extending under the gate electrode, the source, source extension, drain and drain extension doped a first type; and a source delta region contained entirely within the source, a region of the source extension intervening between the source delta region and the channel region and a drain delta region contained entirely within the drain, a region of the drain extension intervening between the drain delta region and the channel region, the delta source region and the delta drain region doped a second dopant type, the second dopant type opposite from the first dopant type.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

An angled ion implant is defined as, an implant wherein the dopant species strikes the top surface of a substrate at an incident angle of between about 6° and about 45° measured from an axis normal to the surface of the substrate. All angled ion implants described herein are performed while the substrate is rotating about an axis perpendicular to the top surface of the substrate.

A perpendicular ion implant is defined as an implant wherein the nominal incident angle of the dopant species measured from the top surface of the substrate is 90° plus or minus 3°.

An N-type dopant donates electrons to the silicon lattice while P-type dopants accept electrons from the crystal lattice, so they are opposite type dopants. Examples of N-type dopants include arsenic and phosphorous. An example of a P-type dopant is boron.

Figure 1A:
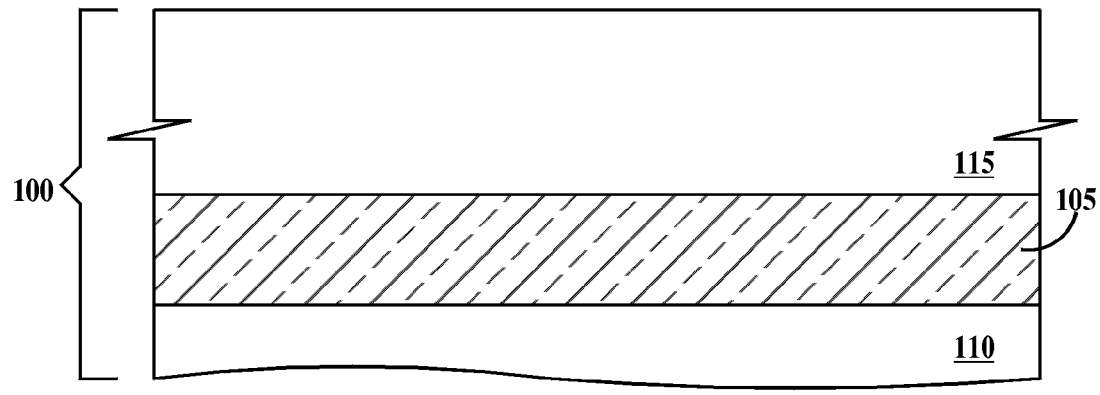
FIGS. 1A through 1O are cross-sectional drawings illustrating fabrication of a field effect transistor according to embodiments of the present invention.

FIGS. 1A through 1O are cross-sectional drawings illustrating fabrication of a field effect transistor (FET) according to embodiments of the present invention.

In FIG. 1A, a silicon-on-insulator (SOI) substrate 100 includes a buried oxide (BOX) layer 105 between a base substrate 110 and a single-crystal silicon layer 115. In one example, substrate 110 is silicon. The fabrication of FETs according to the embodiments of present invention will be described in a SOI substrate, but it should be understood the embodiments of the present invention may be practiced on bulk single-crystal silicon substrates as well, that is, silicon substrates having no buried oxide layer.

Figure 1B:
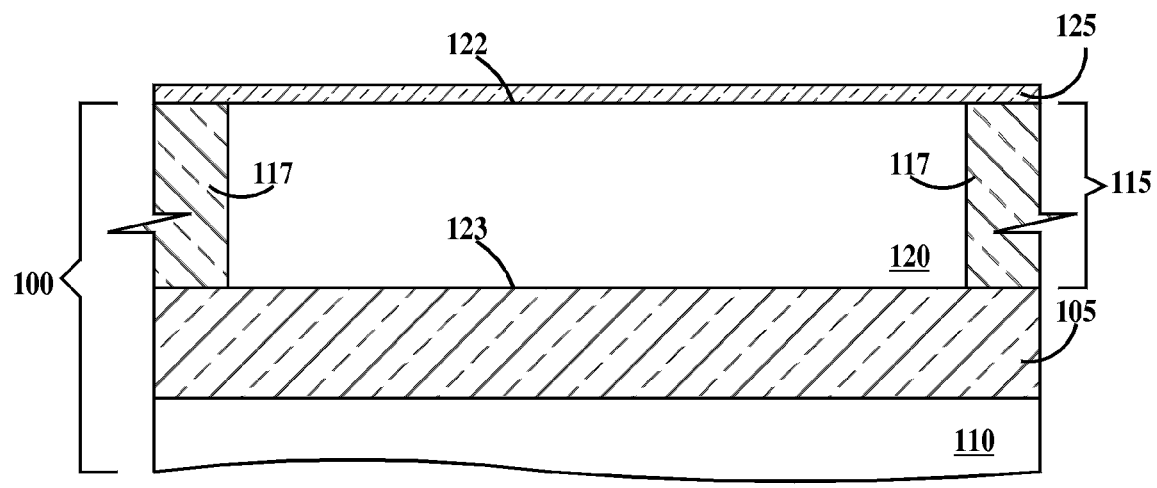

In FIG. 1B, trench isolation 117 and a well 120 are formed in silicon layer 115. Trench isolation may be formed by etching, an opening in a hardmask layer (not shown), depositing an insulator (e.g., silicon oxide) to fill the trench, and then performing a chemical-mechanical polish (CMP), using the hardmask layer as a polish stop. Trench isolation 117 and well 120 extend from a top surface 122 of silicon layer 115 to a top surface 123 of BOX layer 105. For an n-channel FET (NFET) well 120 is doped P-type. For a p-channel FET (PFET) well 120 is doped N-type. In one example, well 120 is formed by ion implantation through a photolithographically patterned photoresist layer. The hardmask layer (not shown) also protects silicon layer 115 from damage during ion implantation. After implanting well 120, any hardmask layer on top surface 122 are removed and a gate dielectric layer 125 is Formed on top surface 122.

A photolithographic process is one in which a photoresist layer is applied to a surface, the photoresist layer exposed to actinic radiation through a patterned photomask and the exposed photoresist layer developed to form a patterned photoresist layer. When the photoresist layer comprises positive photoresist, the developer dissolves the regions of the photoresist exposed to the actinic radiation and does not dissolve the regions where the patterned photomask blocked (or greatly attenuated the intensity of the radiation) from impinging on the photoresist layer. When the photoresist layer comprises negative photoresist, the developer does not dissolve the regions of the photoresist exposed to the actinic radiation and does dissolve the regions where the patterned photomask blocked (or greatly attenuated the intensity of the radiation) from impinging on the photoresist layer. After further processing (e.g., an etch or an ion implantation), the patterned photoresist is removed. The photoresist layer may optionally be baked at one or more of prior to exposure to actinic radiation, between exposure to actinic radiation and development, after development.

Figure 1C:
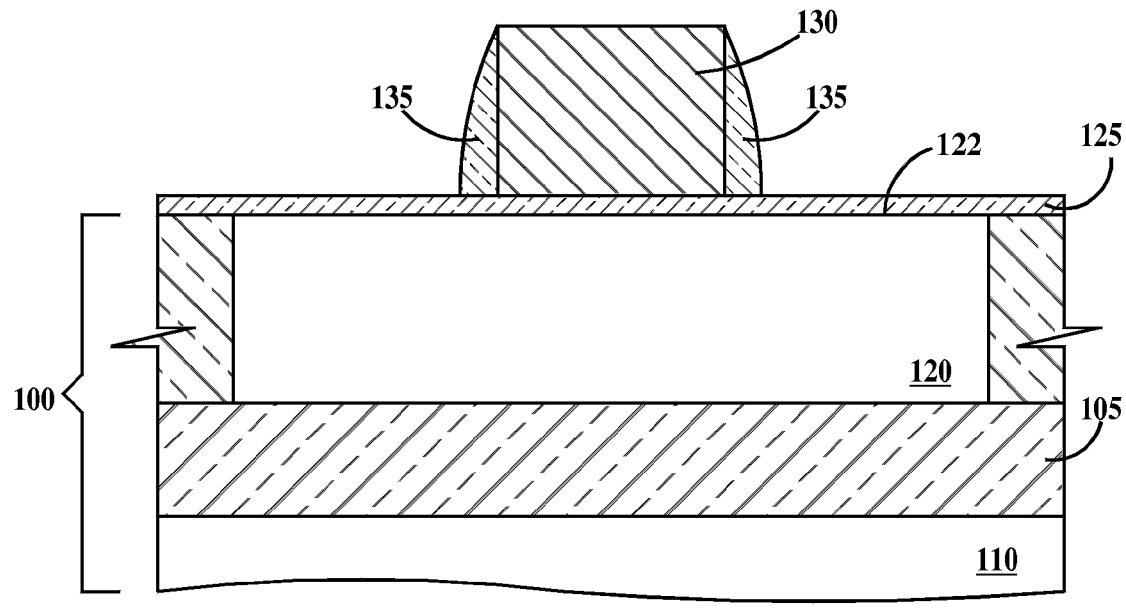

In FIG. 1C, a gate electrode 130 is formed on gate dielectric layer 125. In one example, gate dielectric layer 125 comprises a high K (dielectric constant) material, examples of which include but are not limited metal oxides such as $Ta_2O_5$, $BaTiO_3$, $HfO_2$, $ZrO_2$, $Al_2O_3$, or metal silicates such as $HfSi_xO_y$ or $HfSi_xO_yN_z$ or combinations of layers thereof. A high K dielectric material has a relative permittivity above about 10. In one example, gate dielectric layer 125 is about 0.5 nm to 20 nm thick. In one example, gate electrode 130 comprises polysilicon and is formed by depositing a layer of polysilicon and removing unwanted regions of the polysilicon layer in a photolithographic/reactive ion etch (RIE) etching process. In one example, gate electrode 130 comprises a metal. Next, first sidewall spacers 135 are formed in the sidewalls of gate electrode 130. In one example, first sidewall spacers 135 comprise silicon oxide.

Sidewall spacers may be formed by depositing a conformal layer over a surface having vertical and horizontal surface regions followed by performing a directional RIE in the vertical direction to remove the conformal material from horizontal surfaces at a much faster rate than from vertical surface. The vertical direction is perpendicular to top surface 122 and the horizontal direction is parallel to top surface 122.

Figure 1D:
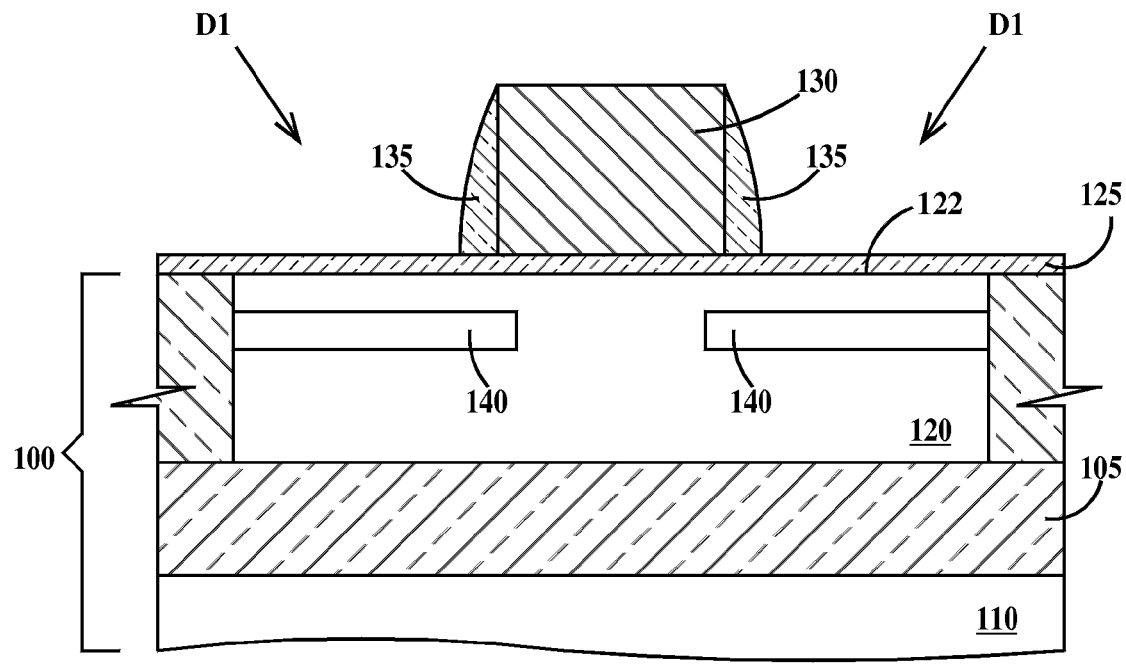

In FIG. 1D, an angled first ion implantation of a first dopant species D1 is performed. For an NFET, D1 is a P-type dopant. For a PFET, D1 is an N-type dopant. As a result of the first ion implant, first doped regions 140 are formed in well 120. The first ion implantation may be called a halo implant. First doped regions 140 are buried in well 120 and do not extend to top surface 122. First doped regions 140 do not extent completely under gate electrode 130 so there is a first doped region 140 on either side of the gate electrode separated by a region of well 120. Gate electrode 130 and first sidewall spacers 135 protect regions of well 120 from being implanted by the first ion implantation. In one example, the first angled implant is performed at an angle of between about 10° and about 45°. In one example, the first angled ion implant implants As at between about 30 KeV and about 60 KeV for a PFET and $BF_2$ between about 20 KeV and about 40 KeV for an NFET.

It should be understood, that after ion implantation and prior to activation anneals that the atoms of implanted species are located interstitially in the silicon crystal lattice and only become active as donors and acceptors after the anneal moves the dopant atoms into lattice positions previously occupied by silicon atoms. Before activation anneals, the illustrated boundaries of doped silicon regions are approximations of the locations of regions of different dopant types or the locations of regions of significant differences in dopant concentration between two regions of the same dopant type. After activation anneal, the boundaries of doped regions in silicon are illustrated as PN junctions between regions having a net doping of P-type and a net-doping of N type and that P-doped regions may include some N-dopant species and N-doped regions may include some P-dopant species.

Figure 1E:
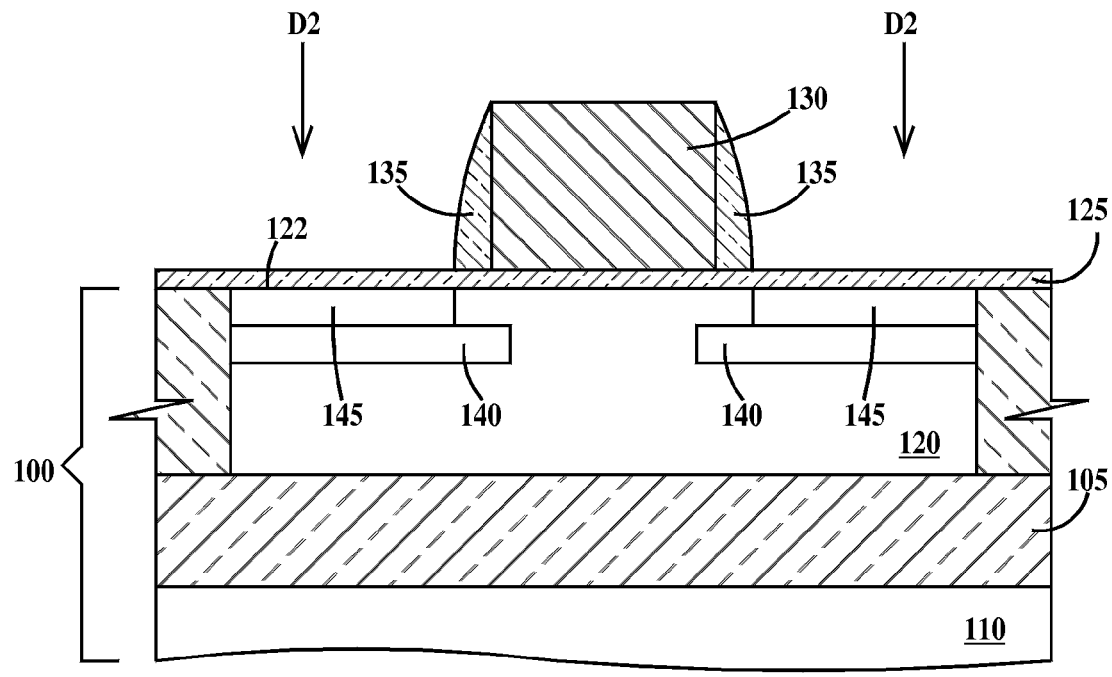

In FIG. 1E, a second ion implantation of a second dopant species D2 is performed. In one example, the second ion implant is a perpendicular ion implant. For an NFET, D2 is an N-type dopant. For a PFET, D2 is a P-type dopant. As a result of the second ion implant, second doped regions 145 are formed in well 120. The second ion implantation may be called an extension implant or a source/drain extension implant. Second doped regions 145 extend between top surface 122 and first doped regions 140. Second doped regions 145 do not extend completely under gate electrode 130 so there is a second doped region 145 on either side of the gate electrode separated by a region of well 120. Gate electrode 130 and first sidewall spacers 135 protect regions of well 120 from being implanted by the second ion implantation.

Figure 1F:
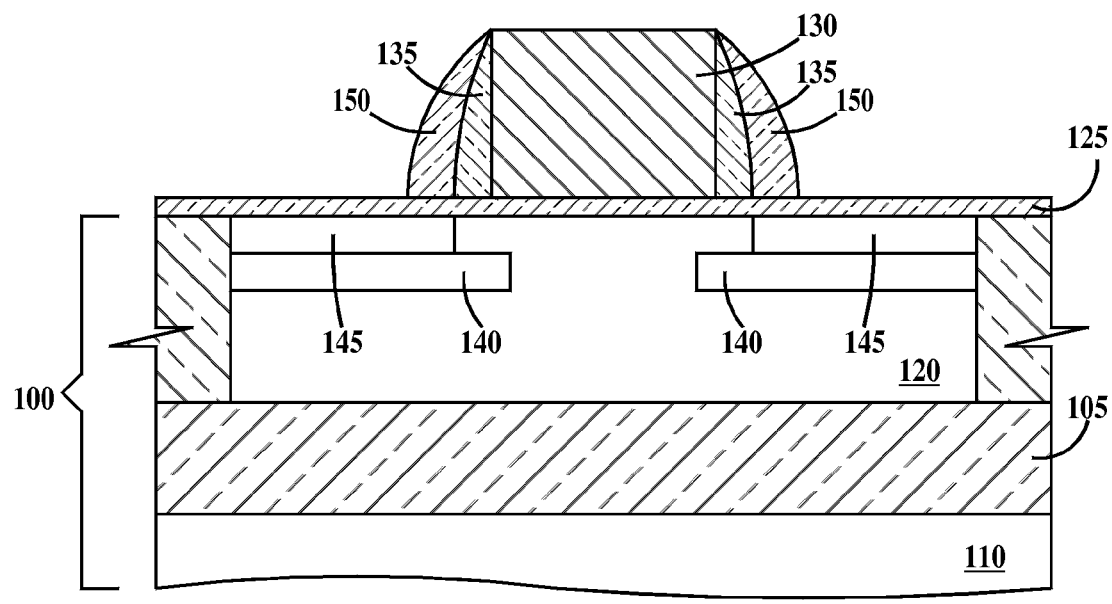

In FIG. 1F, second sidewall spacers 150 are formed on first sidewall spacers 135. In one example, second sidewall spacers 175 comprise a different material as first sidewall spacers 135. In one example, second sidewall spacers 150 comprise silicon nitride.

Figure 1G:
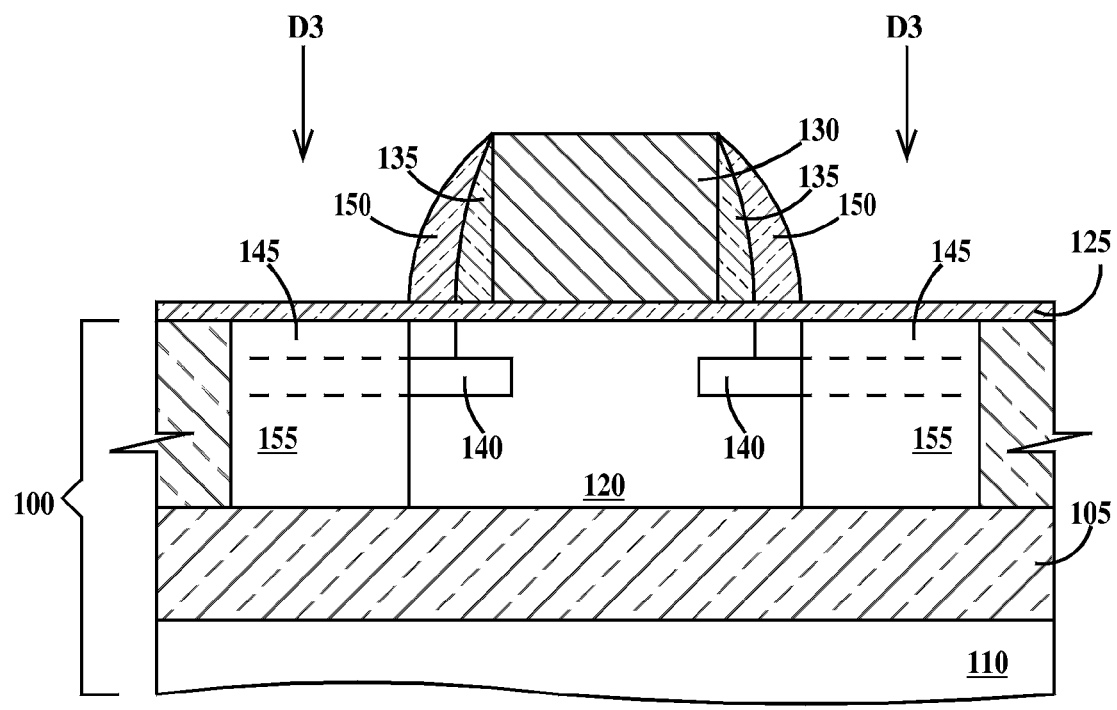

In FIG. 1G, a third ion implantation of a third dopant species D3 is performed. For an NFET, D3 is an N-type dopant. For a PFET, D3 is a P-type dopant. The third ion implant is a perpendicular ion implant. As a result of the third ion implant, third doped regions 155 are formed in well 120. The third ion implantation may be called a source/drain implant. Third doped regions 155 extend from top surface 122 through first and second doped regions 140 and 145 toward BOX layer 105. Third doped regions 155 may extend to contact BOX layer 105 (as illustrated), or a region of well 120 may intervene between third regions 155 and the BOX layer. Third doped regions 155 do not extent completely under gate electrode 130 so there is a third doped region 155 on either side of the gate electrode separated by a region of well 120. Gate electrode 130, first sidewall spacers 135 and second sidewall spacers 150 protect regions of well 120 from being implanted by the third ion implantation.

Figure 1H:
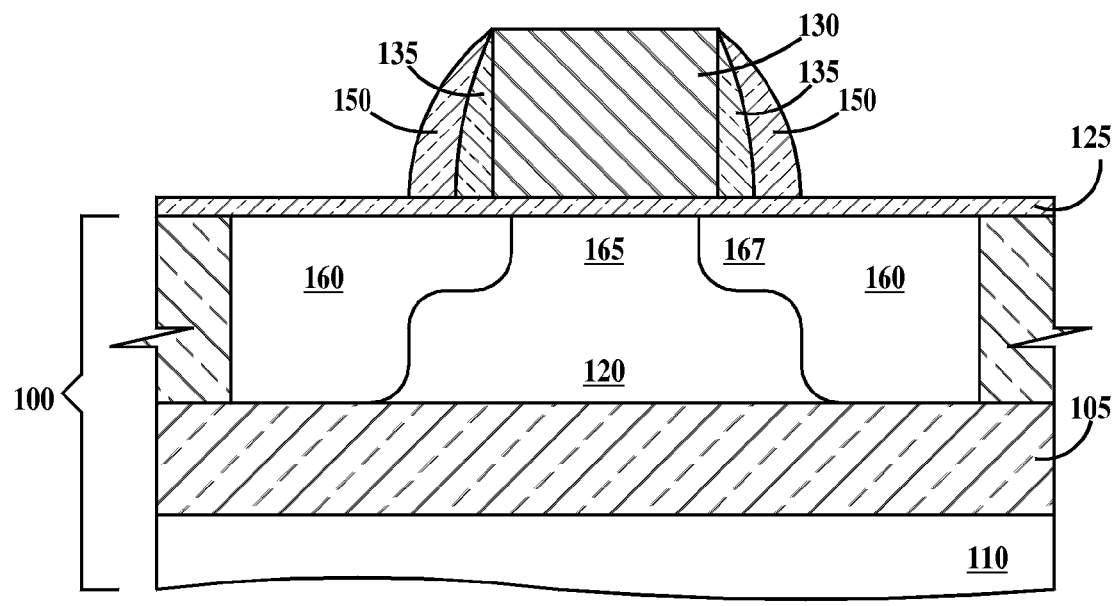

In FIG. 1H, an activation anneal has been performed to form source/drains 160 in well 120, separated by a channel region 165 under gate electrode 165. In one example, the activation anneal is a rapid thermal anneal. In one example, the activation anneal is a rapid thermal anneal between about 1500° C. and about 1700° C. Extension regions 167 of source/drains 160 extend under gate electrode 107. Source/drains 160 may extend to contact BOX layer 105 (as illustrated), or a region of well 120 may intervene between source/drains 160 and the BOX layer.

Figure 1I:
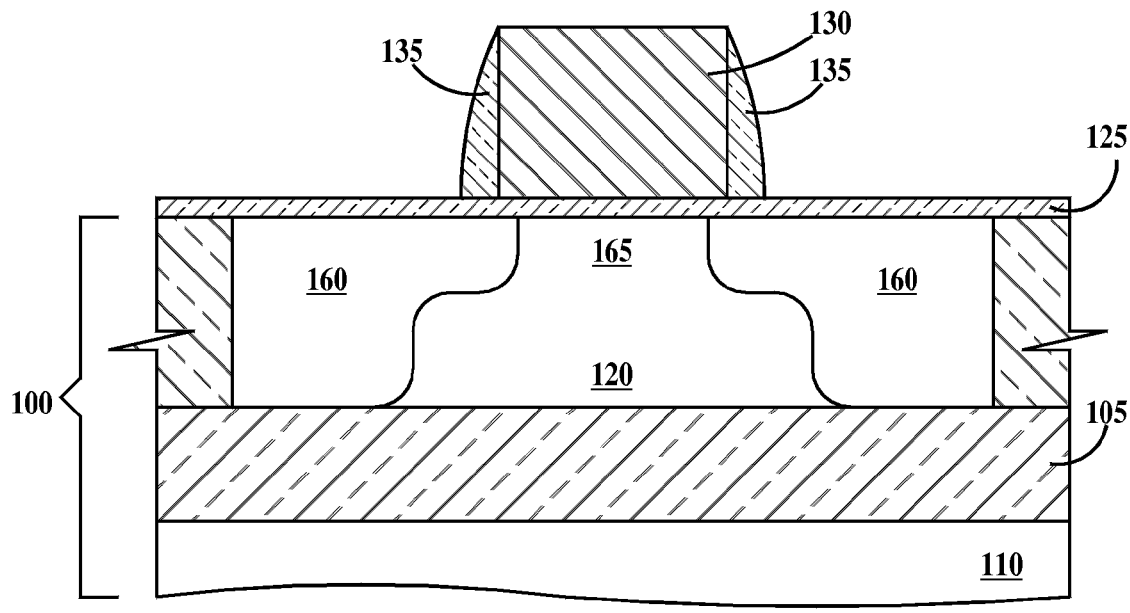

In FIG. 1I, second sidewall spacers 150 (see FIG. 1H) are removed. In one example, when second sidewall spacers 15D comprise silicon nitride and first sidewall spacers comprise silicon oxide, the second sidewall spacers are removed using a hot aqueous solution of phosphoric acid. In one example, second sidewall spacers 150 may be removed using a plasma etch (selective to silicon oxide when first sidewall spacers comprise silicon oxide and second sidewall spacers comprise silicon nitride).

Alternatively, the activation anneal may be performed after removing second sidewall spacers 150 (see FIG. 1H).

Figure 1J:
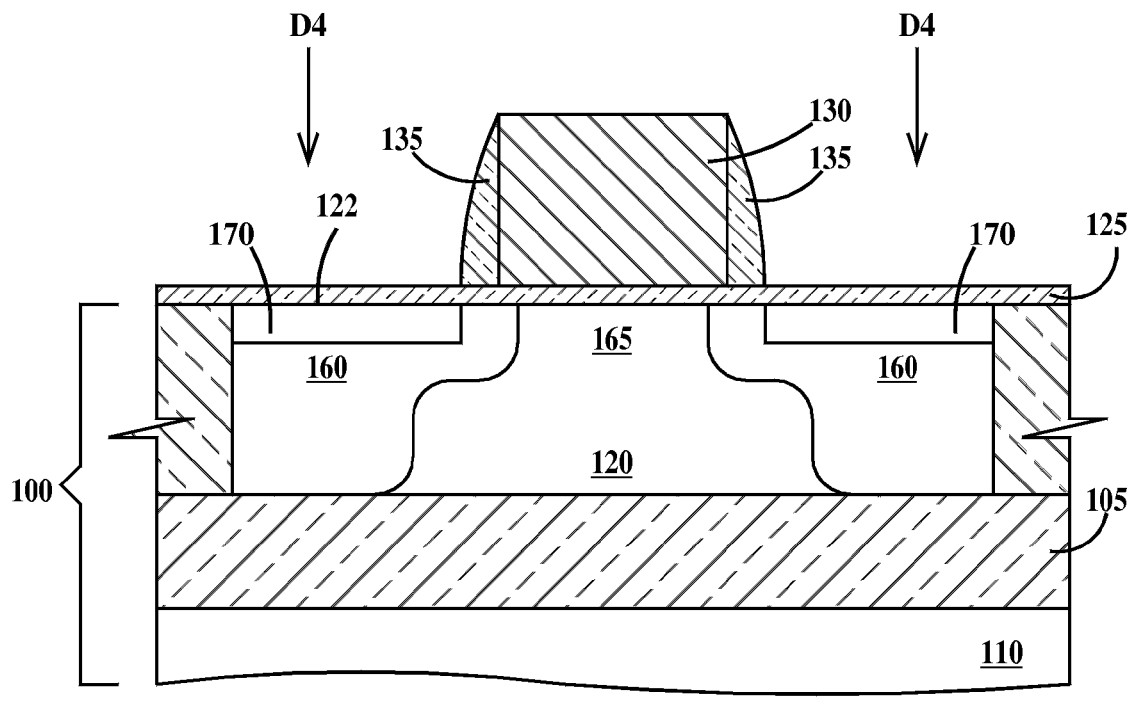

In FIG. 1J, a fourth ion implantation a of a fourth dopant species D4 is performed. For an NFET, D4 is a P-type dopant. For a PFET, D4 is an N-type dopant. The dopant species of the fourth ion implant the opposite type of dopant from the dopant species of the source/drain implant. As a result of the fourth ion implant, counter doped regions 170 are formed in source/drains 160. The fourth ion implant may be called a counter dopant ion implant. Counter doped regions 170 are located abutting (as illustrated) or very proximate to top surface 122 and are contained entirely within source/drains 160. Fourth ion implantation may be an angled ion implant or a perpendicular ion implant. Gate electrode 130 and first sidewall spacers 135 protect regions of well 120 from being implanted by the fourth ion implantation. In one example, fourth ion implantation comprises implanting $BF_2$ at between about 3 KeV and about 5 KeV or B at about 1 KeV for an NFET and As at between about 2 KeV and about 4 KeV for PFET. The fourth ion implantation may be performed at an incident angle of between about 0° and about 5°. In one example, dose ranges (for either an NFET or PFET) from about $5E12$ atm/$cm^2$ to about $1 E14$ atm/$cm^2$.

Figure 1K:
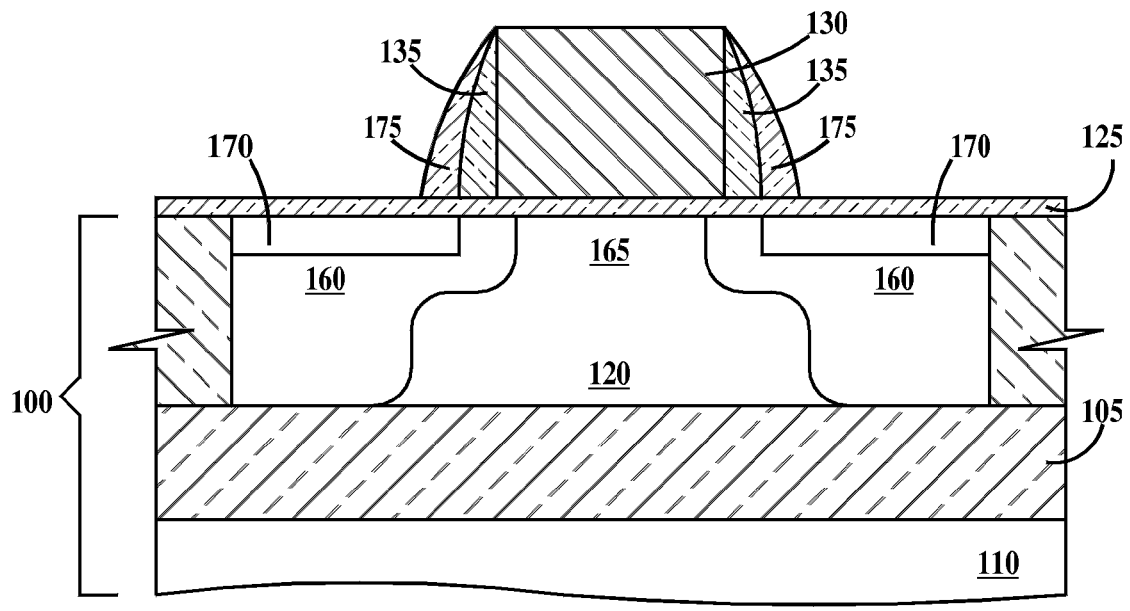

In FIG. 1K, third sidewall spacers 175 are formed on first sidewall spacers 135. In one example, third sidewall spacers 175 comprise the same materials as first sidewall spacers 135. In one example, third sidewall spacers 175 comprise silicon oxide.

Figure 1L:
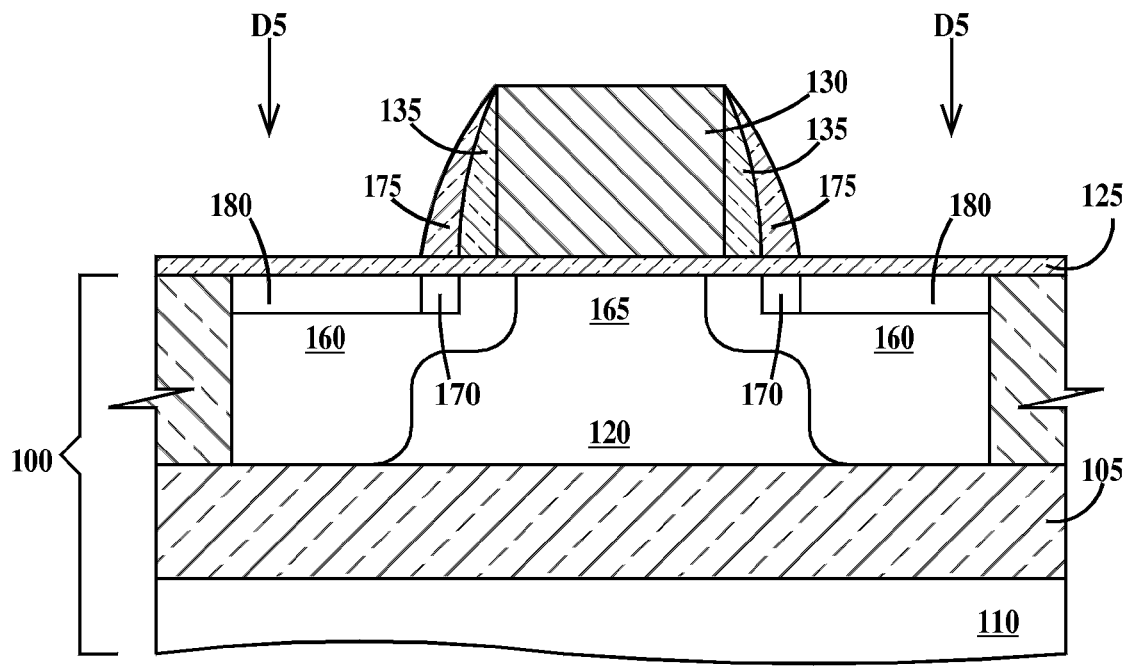

In FIG. 1L, a fifth ion implantation of a fifth dopant species D5 is performed. For an NFET, D5 is an N-type dopant. For a PFET, D5 is a P-type dopant. The dopant species of the fifth is the opposite type of dopant from the dopant species of the counter dopant implant. As a result of the fifth ion implant or counter-counter dopant ion implant, counter-counter doped regions 180 are formed in counter doped regions 170 wherever the counter doped region is not protected by first and third sidewall spacers 135 and 175. The fifth ion implant may be called a counter-counter ion implant. Counter-counter doped regions 180 are located abutting (as illustrated) or very proximate to top surface 122 and are contained entirely within source/drains 160. Fifth ion implantation is a perpendicular ion implant. Gate electrode 130, first sidewall spacers 135 and third sidewall spacers 175 protect regions of well 120 from being implanted by the fifth ion implantation.

Figure 1M:
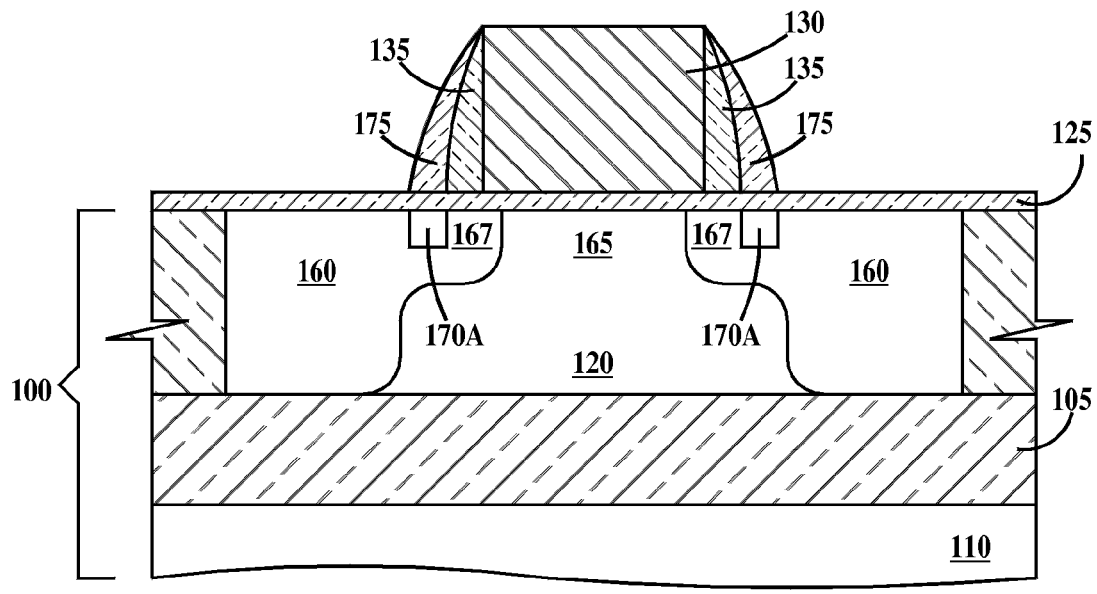

In FIG. 1M, a diffusionless activation anneal is performed to activate counter doped region 170 and counter-counter doped region 180 (see FIG. 1L) to form a delta doping region 170A. After the diffusionless activation anneal delta regions 170A remain essentially where they were in respective extension regions 167. After the diffusionless activation anneal the counter and counter-counter doped regions substantially "cancel" each other out so the net dopant concentration of source/drains 160 are restored in regions that saw both the fourth and fifth ion implantations. In one example, the ion-implantation dose of the fourth ion implantation is about the same as the ion-implantation dose of the fifth ion implantation. Delta regions 170A are located close enough to gate electrode 130 so as to be within the electric field generated by the gate electrode when bias voltage is applied to the gate electrode. For an NFET, delta regions 170A have a net P-type dopant level. For a PFET, delta regions 170A have a net N-type dopant level. If the fourth ion implantation was a perpendicular ion implant, delta regions 170A will be aligned substantially only under third sidewall spacers 170A. If the fourth ion implantation was an angled ion implant, delta regions 170A will be aligned under third sidewall spacers 170A and extend partially under first sidewall spacers 135.

A diffusionless activation anneal is defined as a type of activation anneal that causes little to no diffusion of dopant atoms before the diffusionless activation anneal. Little to diffusion is defined as limiting diffusion distances of dopant species to no more than about 20 Å from where the species was after ion implantation and before the diffusionless activation anneal. Examples of diffusionless activation anneals include, but are not limited to flash arc lamp anneal and laser anneal (which includes sub-melt laser anneal and melt laser anneal). In one example, a flask arc lamp anneal is performed rising the silicon temperature from room temperature to between about 900° C. and about 1300° C. and back to room temperature in about 5 milliseconds to about 10 milliseconds. In one example, a laser anneal is performed rising the silicon temperature from room temperature (e.g. about 20° C.) to between about 1100° C. and about 1350° C. and back to room temperature in between about 5 picoseconds and about 100 nanoseconds.

In other examples for flash arc lamp anneal, ramp up rates are between about $1E5°$ C./second and about $1E6°$ C./second, peak temperature times are less than about $1E6$ seconds, ramp down rates are about $1E6$ seconds, and effective anneal time is between about 0.1 milliseconds and about 2 milliseconds. In other examples for sub-melt laser anneal, ramp up rates are between about $1E5°$ C./second and about $1E6°$ C./second, peak temperature times are less than about $1E6$ seconds, ramp down rates are greater than about $1E6$ seconds, and effective anneal time is between about 0.1 milliseconds to about 2 milliseconds. In other examples for melt laser anneal, ramp up rates are between about $1E9°$ C./second and about $1F10°$ C./second, peak temperature times are less than about $1E7$ seconds, ramp down rates are greater than about $1E7$ seconds, and effective anneal time is between about 10 nanoseconds and about 100 nanoseconds.

Figure 1N:
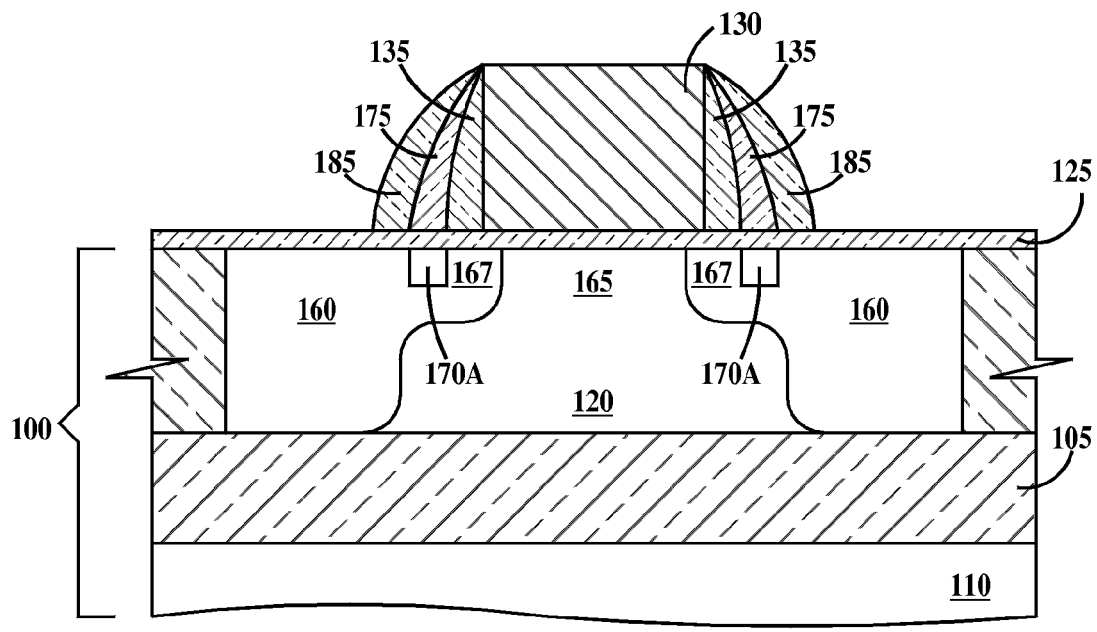
Figure 10:
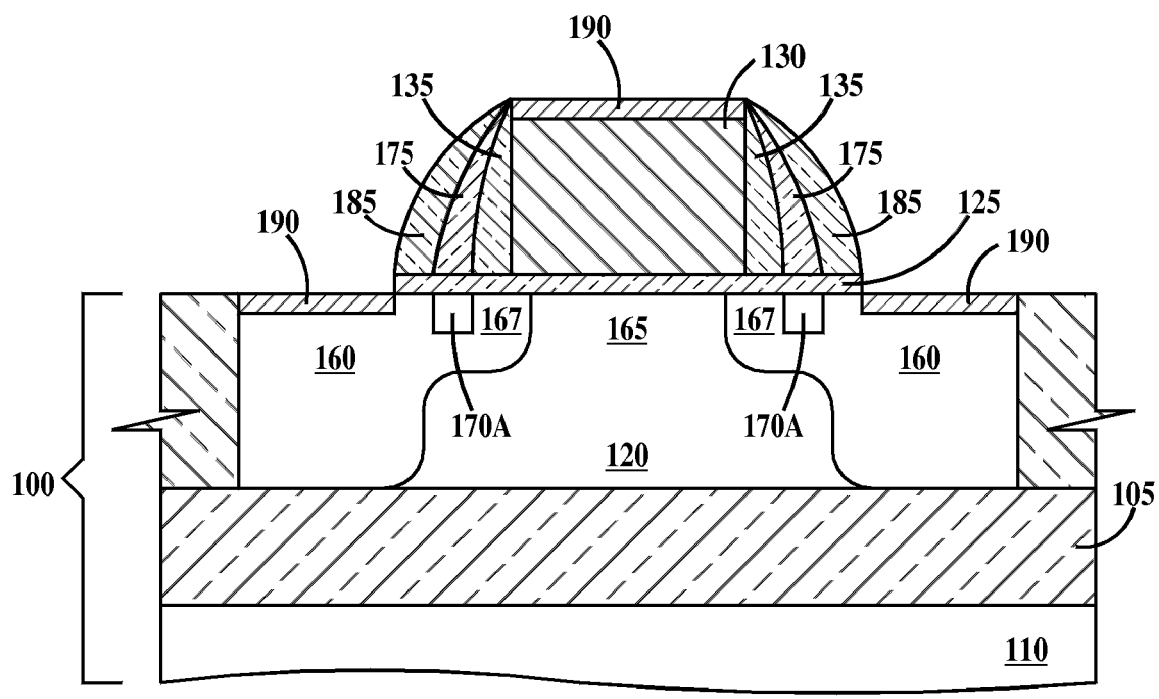

In FIG. 1N, optional fourth sidewall spacers 185 are formed on third sidewall spacers 1755. In one example, fourth sidewall spacers 185 comprise the same materials as second sidewall spacers 150 (see FIG. 1F). In one example, fourth sidewall spacers 185 comprise silicon nitride.

In FIG. 1O, gate dielectric layer 125 is removed wherever the gate dielectric layer is not protected by sidewall spacers 135, 175 and 185 and gate electrode 130 and optional metal silicide contacts 190 to source/drains 160 and gate electrode 190 are formed. Metal silicide contacts 190 may be formed by blanket deposition of a metal layer, heating the metal layer to a temperature high enough to react with silicon, and removing unreacted metal. Metal silicides will not be formed where the metal layer contacts silicon oxide or silicon nitride.

Delta regions 170A "decouple" source/drain regions 160 from the extension regions 167 proximate to gate dielectric layer 125, so leakage through channel region 165 is greatly reduced (compared to an otherwise identical FET having no delta regions) when the FET is turned off. This improves the $I_{ON}/I_{OFF}$ ratio, where $I_{ON}$ is the current from source to drain when the FET is on (no bias on the gate for a PFET, bias on the gate for a PFET) and $I_{OFF}$ is the current flow from source to drain when the FET is off. $I_{OFF}$ is comprised of leakage and tunneling current. When the FET is turned on (bias on the gate for a PFET, no bias on the gate for a PFET) gate electric field forward bias the extension/delta PN junction so saturation current ($I_{SAT}$) is unaffected by delta regions 170A.

Thus the embodiments of the present invention provide FETs and methods of fabricating FETs with reduced short channel effects, particularly with higher $I_{ON}/I_{OFF}$ ratios than conventional FETs.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
   (a) forming a gate dielectric layer on a top surface of a silicon region of a substrate and forming a gate electrode on a top surface of said gate dielectric layer;
   (b) forming a source extension ion implanted region and a drain extension ion implanted region in said silicon region of said substrate on opposite sides of said gate electrode and forming a source ion implanted region and a drain ion implanted region in said silicon region of said substrate on opposite sides of said gate electrode,
   after (b), (c) performing a thermal activation anneal to form, from said ion implanted regions, a source and a drain separated by a channel region under said gate electrode, said source having a source extension extending under said gate electrode and said drain having a drain extension extending under said gate electrode, said source, source extension, drain and drain extension doped a first dopant type;
   after (c), (d) forming a source delta region contained entirely within said source, a region of said source extension intervening between said source delta region and said channel region and forming a drain delta region contained entirely within said drain, a region of said drain extension intervening between said drain delta region and said channel region, said delta source region and said delta drain region doped a second dopant type, said second dopant type opposite from said first dopant type; and
   wherein (d) includes:
      forming first sidewall spacers on sidewalls of said gate electrode and then performing a counter dopant ion implant of said second dopant type into said source and said drain where said source, source extension, drain and drain extension are not protected by said gate electrode and said first sidewall spacers, said counter ion implant extending into said source extension and said drain extension;
      forming second sidewall spacers on said first sidewall spacers and then performing a counter-counter dopant ion implant of said first dopant type into said source, source extension, drain and drain extension, said counter-counter ion implant extending into said source extension and said drain extension where said source, source extension, drain and drain extension are not protected by said gate electrode and said first sidewall spacers and said second sidewall spacers; and
      performing a diffusionless activation anneal to activate dopants implanted by said counter and counter-counter dopant ion implants.

2. The method of claim 1, wherein said diffusionless activation anneal is a flash arc lamp anneal or a laser anneal.

3. The method of claim 1, wherein after, said diffusionless activation anneal, a net doping type of regions of said source and drain that received both said counter and counter-counter ion implantations is the same as before said counter and counter-counter ion implantations were performed.

4. The method of claim 1, wherein said substrate is a silicon substrate and said silicon region is a silicon layer separated from said silicon substrate by a buried oxide layer.

5. The method of claim 1, wherein said silicon region is doped P-type, said source, source extension, drain and drain extension are doped N-type and said source and drain delta regions are doped P-type.

6. The method of claim 1, wherein said silicon region is doped N-type, said source, source extension, drain and drain extension are doped P-type and said source and drain delta regions are doped N-type.

7. The method of claim 1, wherein said source and said drain do not extend under said gate electrode, said source delta region is contained entirely within said source extension, and said drain delta region is contained entirely within said drain extension.

8. A method of fabricating a field effect transistor, comprising:
   (a) forming a gate dielectric layer on a top surface of a silicon region of a substrate and forming a gate electrode on a top surface of said gate dielectric layer;
   after (a), (b) forming first sidewall spacers on sidewalls of said gate electrode;
   after (b), (c) performing an angled halo ion implantation of a first dopant type and a perpendicular extension ion implantation of a second dopant type into said silicon region, said second dopant type opposite from said firs dopant type;
   after (c), (d) forming second sidewall spacers on said first sidewall spacers;
   after (d), (e) performing a perpendicular or angled source/drain ion implantation of said second dopant type into said silicon region;
   after (e), (f) performing a first activation anneal to form a source and a drain in said silicon region on opposite sides of said gate electrode, said source and said drain separated by a channel region under said gate electrode, said source having a source extension extending under said gate electrode and said drain having a drain extension extending under said gate electrode;
   after (e), (g) removing said second sidewall spacers;
   after (f) and (g), (h) performing a perpendicular counter ion implantation of said first dopant type into said source and said drain;
   after (h), (i) forming third sidewall spacers on said first sidewall spacers;
   after (i), (j) performing a perpendicular counter-counter ion implantation of said second dopant type into said source and said drain; and
   after (j), (k) performing a diffusionless second activation anneal to form a source delta region contained entirely within said source, a region of said source extension intervening between said source delta region and said channel region and to form a drain delta region contained entirely within said drain, a region of said drain extension intervening between said drain delta region and said channel region.

9. The method of claim 8, further including:
after (k), (l) forming fourth sidewall spacers on said third sidewall spacers.

10. The method of claim 9, further including:
after (l), (m) forming respective metal silicide contacts to said gate electrode, said source and said drain.

11. The method of claim 8, wherein said diffusionless second activation anneal is a flash arc lamp anneal or a laser anneal.

12. The method of claim 8, wherein after said diffusionless second activation anneal, a net doping type of regions of said source and drain that received both said counter and counter-counter ion implantations is the same as before said counter and counter- counter ion implantations were performed.

13. The method of claim 8, wherein said substrate is a silicon substrate and said silicon region is a silicon layer separated from said silicon substrate by a buried oxide layer.

14. The method of claim 8, wherein said silicon region is doped P-type, said source, source extension, drain and drain extension are doped N-type and said source and drain delta regions are doped P-type.

15. The method of claim 8, wherein said silicon region is doped N-type, said source, source extension, drain and drain extension are doped P-type and said source and drain delta regions are doped N-type.

* * * * *